United States Patent [19]

Nishizawa et al.

[11] Patent Number: 4,502,203
[45] Date of Patent: Mar. 5, 1985

[54] METHOD FOR FABRICATING SEMICONDUCTOR PHOTODETECTOR

[75] Inventors: Junichi Nishizawa, No. 6-16, Komegafukuro 1-chome, Sendai-shi, Miyagi; Soubei Suzuki; Takashige Tamamushi, both of Miyagi, all of Japan

[73] Assignee: Junichi Nishizawa, Japan

[21] Appl. No.: 561,243

[22] Filed: Dec. 13, 1983

[30] Foreign Application Priority Data

Dec. 13, 1982 [JP] Japan .................................. 57-218590

[51] Int. Cl.³ .................... H01L 21/22; H01L 148/187
[52] U.S. Cl. ........................................ 29/571; 29/572; 29/578; 148/187
[58] Field of Search ........................... 29/571, 572, 578

[56] References Cited

U.S. PATENT DOCUMENTS

| | | | |
|---|---|---|---|
| 4,377,900 | 3/1983 | Nonaka et al. | 29/571 |
| 4,406,052 | 9/1983 | Cogan | 29/578 X |
| 4,409,725 | 10/1983 | Hotta et al. | 29/571 |
| 4,442,592 | 4/1984 | Kemmer | 29/572 |
| 4,446,175 | 8/1984 | Coe | 148/187 X |
| 4,449,284 | 5/1984 | Shimbo | 29/578 X |

Primary Examiner—G. Ozaki
Attorney, Agent, or Firm—Sughrue, Mion, Zinn, Macpeak and Seas

[57] ABSTRACT

A method for fabricating a photodetector device including a single pixel or an array of pixels, each of which is constituted by a single vertical type SIT (Static Induction Transistor). First and second main electrode regions are formed on respective first and second main surfaces of a silicon wafer. Control gate and shielding gate regions, as well as drain and source regions as well, are formed using a single common masking step. As a result, the formation of these regions is precisely controlled, resulting in superior photoresponse characteristics.

4 Claims, 16 Drawing Figures

4,502,203

METHOD FOR FABRICATING SEMICONDUCTOR PHOTODETECTOR

BACKGROUND OF THE INVENTION

The present invention relates to a method for fabricating a semiconductor photodetector. More particularly, the invention relates to a method for fabricating a semiconductor photodetector element composed of a single SIT (Static Induction Transistor) or a plurality of such transistors formed in an array.

The present inventors have developed a semiconductor imaging device which includes pixels constituted each by a single SIT which performs both a photodetecting function and a switching function. Such a device is disclosed in Japanese Patent Application Nos. 204656/1981 and 157693/1982 filed on Dec. 17, 1981 and Sept. 9, 1982, respectively.

The SIT constituting the semiconductor image device includes an $n^+$ type drain region 3, a $p^+$ type control gate region 4 and a $p^+$ type shielding gate region 5, which are formed in an $n^-$ type epitaxial layer 2 formed on an $n^+$ type Si substrate 1 as shown in FIG. 1. The $p^+$ type shielding gate region 5 is formed such that it surrounds the $n^+$ type drain region 3 and the $p^+$ type control gate region 4 and functions to isolate them from adjacent pixels by means of a depletion layer.

The $n^+$ type substrate 1 forms a source region which is common to all of the pixels formed therein. A drain electrode 8 is connected to the $n^+$ type drain region 3 and a source electrode 10 is connected to the source region 1. A control gate electrode 9 is connected through a gate capacitor formed by a gate insulating layer 7 to the control gate region 4.

The SIT pixel formed as described above includes a vertical SIT 20 and a gate capacitor 21 formed between the electrodes 8, 9 and 10 as shown in FIG. 2. The source electrode 10 is grounded, the control gate electrode 9 receives a readout pulse signal $\phi_G$ and the drain electrode 8 is connected through a switch 22, which is turned on upon receipt of a pulse of a video line selection signal $\phi_S$, to a biasing circuit 23 and a readout terminal 24.

When the SIT pixel is irradiated with light under a biased condition, electron-hole pairs are produced around the control gate region 4. Electrons of these pairs flow into the source electrode 10 where they are collected. On the other hand, holes are accumulated in the control gate region 4, which forms a floating electrode of capacitor 21.

The SIT is still in a nonconductive state, even when a large number of holes has been accumulated. When a positive pulse of the gate signal $\phi_G$ is supplied through the gate capacitor 21, the barrier potential of the true gate is lowered, causing a current to flow through the SIT 20, with the magnitude of the current being dependent on the amount of holes accumulated in the control gate region 4, that is, by the amount of light falling on the SIT pixel. The current value is read out at a terminal 24 as a video signal.

In the above described SIT structure, the $p^+$ type shielding gate region 5 functions to separate electrostatically the adjacent pixels from one another. In this case, it may be possible to use the $n^+$ type regions 3 and 1 as the source region and the drain region, respectively.

An imaging device composed of an array of such SITs having a common shielding gate region is much simpler in structure than a conventional imaging device constituted by pixels each having both a diode for photodetection and an MOS transistor for switching because the SIT performs the photodetection function as well as the switching function. Therefore, it becomes possible to substantially increase the integration density of the circuit. Furthermore, an imaging device composed of an array of SITs having a common shielding gate region exhibits a very high photodetectivity and has no switching noise, which is inherent to the MOS device. Although the imaging device disclosed in Japanese Patent Applications Nos. 204656/1982 and 157693/1982 is constituted with a two-dimensional array of SITs having a common shielding gate region, it is possible to form an imaging device with one-dimensionally arranged SITs having a common shielding gate region. It is, of course, possible to use a single SIT as a photoelectric converter. Therefore, it should be noted that, as used herein, the term "photodetector" means inclusively a photoelectric converter constituted by a single SIT and an imaging device constituted by a plurality of SITs arranged in an array with a common shielding gate region.

A photodetector composed of an SIT or multiple SITs performing both a photodetecting function and a switching function has been proposed as a substitute for the conventional MOS type photodetector. However, the development of SIT photodetectors at present is still in the initial stages, and effective methods for fabricating an SIT photodetector have not heretofore been available.

Furthermore, in the above-described SIT having a drain region between the control and shielding gate regions, the positional relations between the drain (source) region 3 and the control gate region 4 and between the region 4 and the shielding gate region 5 strongly affect various characteristics of the SIT. For example, as disclosed in Japanese Patent Application No. 157693/1982, it is possible to improve the photosensitivity of a device of this type by forming the drain (source) region 3 closer to the shielding gate region 5. Therefore, in fabricating a photodetector using a SIT or SITs, it is very important to form the drain (source) region, the control gate region and the shielding gate region with a high precision, while maintaining the relative positions thereof exactly.

SUMMARY OF THE INVENTION

An object of the present invention is to provide a method for fabricating a photodetector including an SIT or multiple SITs each having a structure as described above. More particularly, an object of the invention is to provide a method for fabaricating an SIT photodetector in which a drain (source) region, a control gate region and a shielding gate region are formed while maintaining precisely a desired positional relationship therebetween. The photodetector, of the invention is a vertical type in which first and second main electrode regions are formed on first and second main surfaces of a silicon wafer.

A method of the invention includes the following steps:

(a) forming an oxide layer and a nonoxidizing layer on the main surface of the silicon wafer in that order;

(b) removing at least the nonoxidizing layer, except in an area in which a control gate region is to be formed, an area surrounding the control gate region in which a shielding gate region is to be formed, and an area between these two areas in which a first electrode region is to be formed;

(c) forming a field oxide layer by preferentially oxidizing the area in which the nonoxidizing material layer has been removed (In the case where the photodetector to be fabricated includes a plurality of the SITs in an array, a plurality of sets, each including an area for the control gate region, an area for the first electrode region and an area for a common shielding gate region, are formed, and at least the nonoxidizing layer is removed as above. The areas where the nonoxidizing layer has been removed are selectively oxidized to form a field oxide layer.);

(ii) removing at least the nonoxidizing layer on the areas for the control gate region and the shielding gate region, and forming the control gate region and the shielding gate region, each having an oxide layer thereon, in the first main surface, then removing the nonoxidizing layer and the oxide layer on the area of the first main electrode area to form the first main electrode region in the first main surface;

(iii) forming an electrode of a first conductive material in the first main electrode area, and then covering the entirety of the first main surface with a first insulating layer;

(iv) removing the first insulating layer and the oxide layer on the control gate region and then covering the entirety of the first main surface with a second insulating material;

(v) forming an electrode of a second conductive material on the second insulating material layer on the control gate region;

(vi) removing the second insulating material layer, the first insulating material layer and the oxide layer on at least a portion of the shielding gate region to form a contact hole, and covering the entirety of the first main surface with a metal layer;

(vii) removing the metal layer on at least the control gate region; and (viii) forming an electrode of a second conductive material on the second main electrode region in the second main surface.

DESCRIPTION OF THE PREFERRED EMBODIMENTS

Figure 1:
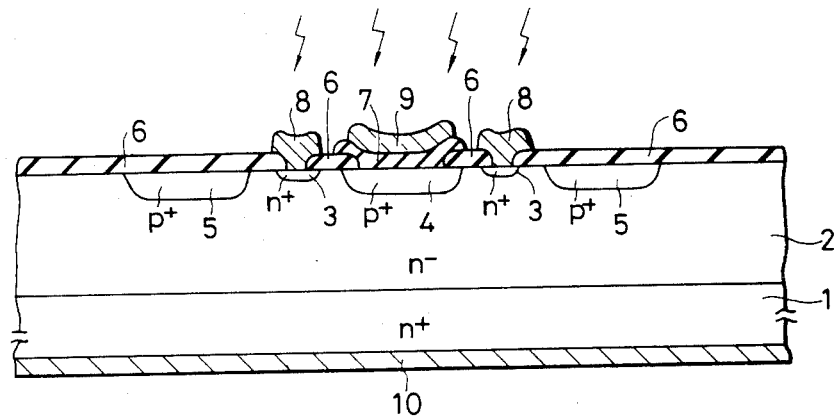
FIG. 1 is a schematic cross-sectional view of an SIT.
Figure 2:
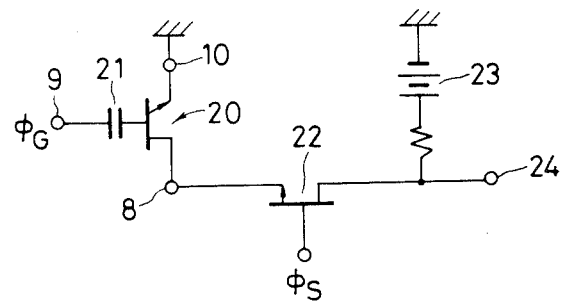
FIG. 2 is a diagram of a circuit used for reading out such an SIT.
Figure 3A:
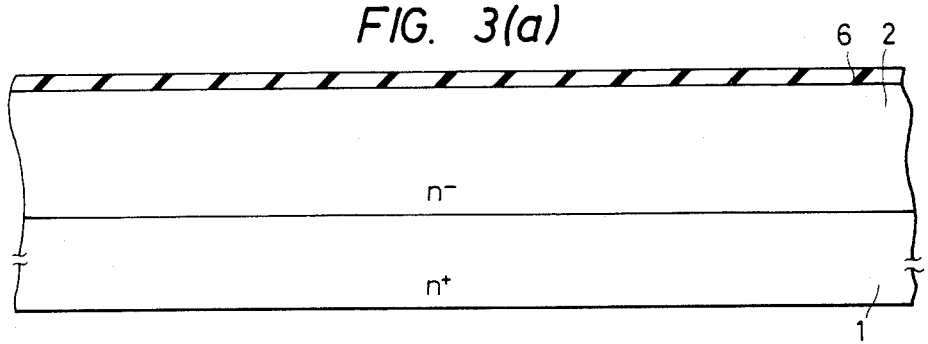
FIGS. 3A through 3M and 4 are schematic cross-sectional views showing an SIT of the present invention in various stages of manufacture.

In FIG. 3A, an n+ type (111) Si substrate 1 having an impurity concentration of $10^{18}$ to $10^{20}$ cm$^{-3}$ is prepared. Although Sb or P etc. may be used as a dopant for forming the n+ type Si substrate 1, it is preferable to use Sb because of its small diffusion coefficient. On the n+ type SI substrate 1, an n− layer 2 about 5 to 10 microns thick and having an impurity density of $10^{13}$ to $10^{15}$ cm$^{-3}$ is epitaxially grown. Then, the wafer is subjected to an oxygen atmosphere at 900 to 1000 degrees C. for 25 to 60 minutes to form an oxide layer of $SiO_2$ on the n− type layer 2 to a thickness of 100 to 500 Å.

Figure 3B:
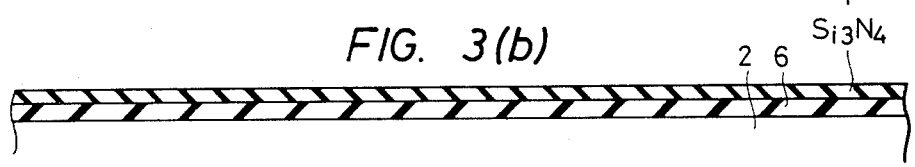

In FIG. 3B, the entire surface of the oxide layer 6 is covered by a nonoxidizing layer. The term "nonoxidizing material" as employed herein means a material which is not oxidized during the step of field oxide formation. The $Si_3N_4$ layer, preferably 1000 to 1800 Å thick, may be formed by CVD using $SiH_4/NH_3$ at 700 to 850 degrees C.

Figure 3C:
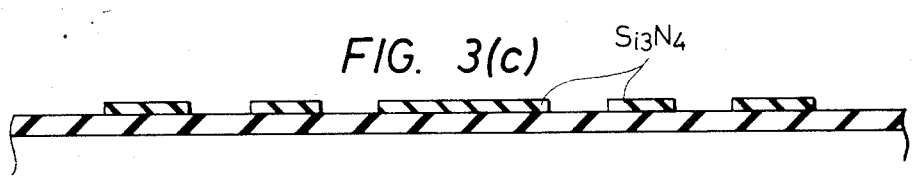

In FIG. 3C, the nonoxidizing layer, except predetermined portions in which the control gate, the shielding gate surrounding the control gate and the drain regions are to be formed, portions in the vicinity of the drain region between the latter two regions (i.e., portions above the control gate region 4), portions in the vicinity of the shielding gate region 5 (FIG. 3E), and the drain region 3 (FIG. 3F), is etched away. The removal of the nonoxidizing layer may be performed by plasma etching using $FC_4$, $CF_4+O_2$, etc. as an etchant (for the case where the nonoxidizing material is $SI_3N_4$).

Although in this embodiment, only portions of the nonoxidizing layer are removed, the oxide layer 6 therebeneath may be removed partially or completely together with the removal of the nonoxidizing layer. Further in this embodiment, although a pair of the drain regions 3 are formed symmetrically with respect to the control gate region, each in an intermediate position between the control gate region 4 and the shielding gate region 5 surrounding the control gate region 4, it should be noted that it suffices to provide at least one drain region 3 in an n− type epitaxial layer 2 between the control gate region 4 and the shielding gate region 5, and the position of the drain region 3 in the area between the regions 4 and 5 is somewhat arbitrary. It is further possible, as disclosed in the aforementioned Japanese Patent Application No. 157693/1982, to improve the photosensitivity of the SIT by forming the drain region 3 in the area between the control gate region 4 and the shielding gate region 5 closer to the latter region.

Figure 3D:
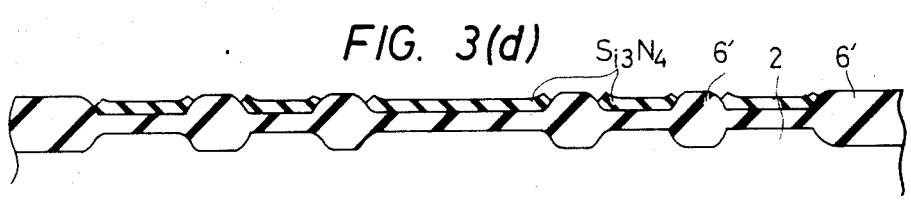

In FIG. 3D, the area from which the nonoxidizing material has been removed is selectively oxidized (LOCOS) and a field oxide layer 6 5000 to 8000 Å thick is formed. This selective oxidation is generally performed by wet oxidation at 1000 to 1100 degrees C.

Figure 3E:
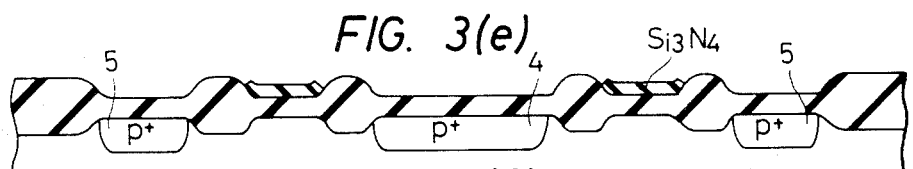

With reference to FIG. 3E, the nonoxidizing layer and the oxide layer 6 in the areas corresponding to the positions of the control and the shielding gate regions are etched away using a masking technique, and then B (boron) is deposited on those portions through thermal decomposition of $BBr_3$ at about 950 degrees C. Thereafter, by thermally diffusing B in an oxidizing atmosphere of wet $O_2$ at around 1100° degrees C., boron-doped p+ type gate regions 4 and 5, each being 2 to 4 microns deep and having an impurity concentration of $10^{18}$ to $10^{21}$ cm$^{-3}$, are formed in the n− layer 2. The gate region 4 is the control gate region and the region 5 is the shielding gate region which surrounds the control gate region 4.

In the case where the nonoxidizing material layer is formed of $Si_3N_4$, the removal thereof may be performed by plasma etching using $CF_4$, $CF_4+O_2$ etc. as an etchant.

The thermal diffusion of B is performed in an oxidizing atmosphere, and therefore another oxide layer is formed on the p+ type gate regions 4 and 5. The p+ type regions 4 and 5 may be formed by ion implantation of B instead of thermal diffusion. In such a case, ion implantation of B may be performed after the oxide layer 6 on these regions is completely removed as in the case of the thermal diffusion, or it may be performed through the oxide layer 6 once its thickness has been reduced by partial removal thereof. In any case, the oxide layer is formed on the p+ type gate regions 4 and 5.

Figure 3F:
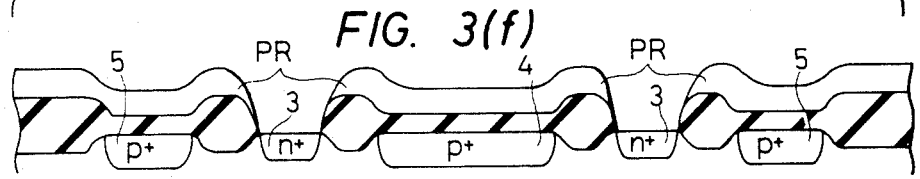

In FIG. 3F, a portion of the nonoxidizing layer in an area between the control gate region 4 and the shielding gate region 5 is completely removed after providing, if necessary, photoresist PR on the remaining nonoxidizing material layer. Then, the layer 6 is removed by wet etching. In a case where the nonoxidizing material layer is formed of $Si_3N_4$, the removal thereof may be performed by plasma etching using $CF_4$, $CF_4+O_3$ etc, as an etchant. Then, an n+ drain region 3 is formed in the n− type epitaxial layer 2 thus exposed. The impurity concentration of the n+ type drain region 3 is $10^{19}$ to $10^{21}$ cm$^{-3}$, and the depth thereof is generally 0.1 to 0.5 microns. As or P may be used as a dopant to form the n+ type drain region 3; As is most preferred. The formation of the n+ type drain region 3 using As as a dopant may be performed by thermal diffusion or ion implantation in a vacuum or in a closed tube.

Figure 3G:
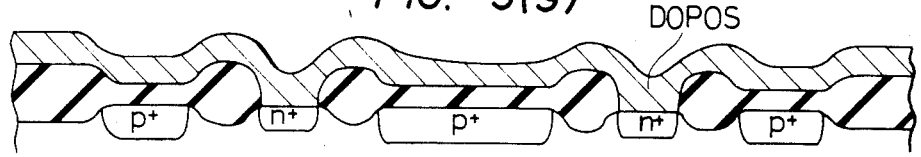

Next, as shown in FIG. 3G, a layer of a first conductive material is deposited on the entire surface of the wafer. As the first conductive material, polycrystalline Si doped with an element such as P, referred to as DOPOS, high melting point metal silicide such as molybdenum silicide, or $SnO_2$, etc. may be used. DOPOS is the most preferred conductive material for this purpose. The deposition of the DOPOS layer may be performed by CVD using a gaseous mixture of $SiH_4$ and $PH_3$.

Figure 3H:
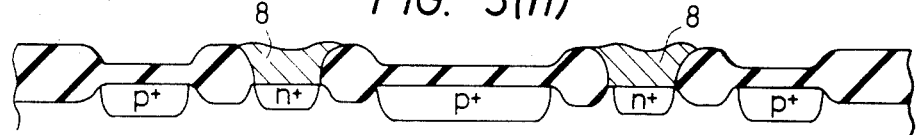

In FIG. 3H, the first conductive material layer, except portions thereof on the n+ type drain regions 3, is etched away using a masking technique to form drain electrodes 8 on the n+ type drain regions 3. When DOPOS is used as the conductive material, it is preferred to perform the removal of the DOPOS layer, except the portion thereof on the n+type drain regions 3, by plasma etching using $CF_4$, $CF_4+O_2$, $PCl_3$, etc. as an etchant.

Figure 3I:
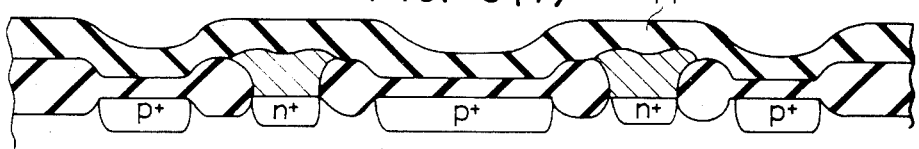

Then, as indicated in FIG. 3I, the entire surface of the wafer is coated with a first insulating layr 11. The coating of the wafer surface with the first insulating layer 11 is generally performed by CVD of phosphosilicic acid glass (PSG) on the entire surface thereof using $SiH_4/O_2/PH_3$ at about 400 degrees C. or $SiH_4/N_2O/PH_3$ at about 750 degrees C.

Figure 3J:
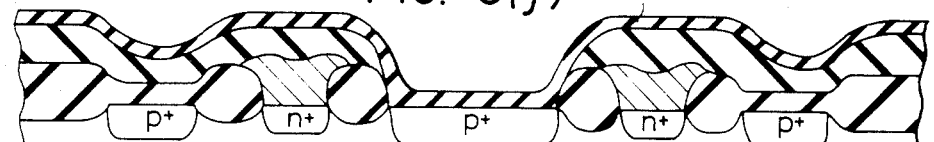

With reference to FIG. 3J, the first insulating layer 11 and the oxide layer on the control gate region 4 are removed by wet etching using a masking technique.

Thereafter, the entire surface is covered by a second insulating layer 12 of a second insulating material. The second insulating layer 12 forms a capacitor in the control gate region 4.

Although $Si_3N_4$, $SiO_2$, $Al_2O_3$, $AlN_3$, etc. are usable as the second insulating material, $Si_3N_4$ is most preferred since the latter has a high dielectric constant and is capable of forming a superior layer at a low temperature, as will be made clear from the discussion below. When the insulating layer 12 is formed of $Si_3N_4$, it may be deposited by CVD using $SiH_4/NH_3$ at 400 to 700 degrees C. to form a layer having a thickness of 50 to 100 Å.

Figure 3K:
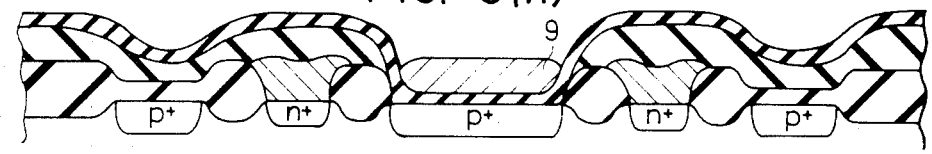

In FIG. 3K, the entire surface of the wafer is covered by a conductive layer of a second conductive material, and then that conductive layer is etched away except a portion thereof on the control gate region 4 which corresponds to the capacitor 7 by using a masking technique, thus to form a control gate electrode 9 on the second insulating layer 12 above the control region 4.

Since this electrode 9 is provided on the control gate region 4 which is adapted to be used as a light receiving portion, the control gate electrode 12 should be as transparent as possible. Further, the thickness thereof should generally be in the range of 2000 to 5000 Å. A conductive mataerial such as Sb-doped $SnO_2$, DOPOS, $In_2O_3$, $Ta_2O_5$ or Al may be used for the control gate electrode 9. Particularly, Sb-doped $SnO_2$ or DOPOS is preferable. If Sb-doped $SnO_2$ is used as the electrode material, a layer of Sb-doped $SnO_2$ is deposited on the entire surface of the wafer by CVD using $SnCl_2/SbCl_5$, and then the $SnO_2$ layer, except a portion thereof on the control gate region 4, is removed by plasma etching with masking. In this case, the etchant used is preferably $CCl_4$. On the other hand, when DOPOS is used as the conductive material, the DOPOS layer is deposited on the entire surface of the wafer by CVD using $SiH_4/PH_3$, and then the DOPOS layer, except at least a portion thereof on the control gate region 4, is plasma etched using masking. In this case, an etchant such as $CF_4$, $CF_4+O_2$ or $PCl_3$ may be used. When the incident radiation to be sensed is high energy radiation such as electron beam radiation, aluminum may be used as the control gate electrode material.

Figure 3L:
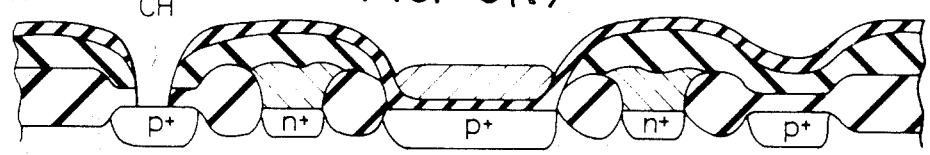

As seen in FIG. 3L, the second insulating layer 12, the first insulating material layer 11 and the oxide layer on a portion of the shielding gate region 5 are removed to form a contact hole CH. In more detail, after masking the entire surface of the wafer except locations corresponding to a position at which a contact hole is to be formed, the second insulating material layer 12, which may be formed of $Si_3N_4$, is plasma etched. Then, the first insulating layer 11, which may be formed of PSG, and the oxide layer are removed by wet etching. It is not always necessary to provide one contact hole for each SIT. The number of the contact holes and the locations thereof should be determined taking into account the number of SITs constituting the photodetector and the resistance value of the shielding gate region 5.

Figure 3M:
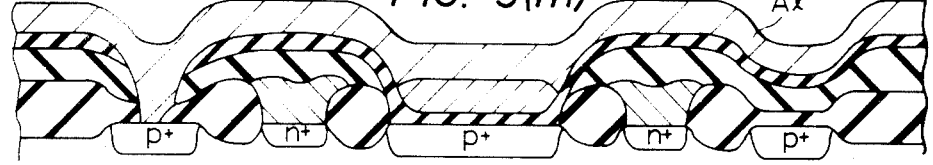
Figure 4:
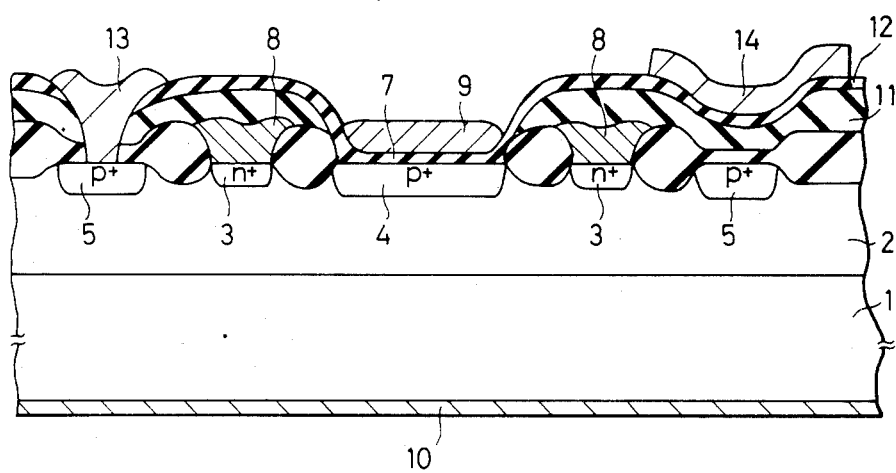

In FIG. 3M, the entire surface of the wafer is coated with metal layer about 1.0 micron thick. The metal layer 13 is formed by depositing aluminum containing 0 to 10% Si on the surface of the wafer by using electron beam deposition or sputtering. Thereafter, at least a portion of the metal layer on the control gate region is removed, and then an electrode 10 formed, for instance, of aluminum, is deposited on the entirety of the rear side surface of the wafer, namely, the surface of the n+ type Si substrate 1 (n+ type source region) as shown in FIG. 4. The wafer thus prepared is annealed in a vacuum, an inert gas or hydrogen at 400 to 450 degrees C.

In the SIT thus fabricated, an example of which is shown in FIG. 4, although the metal layer is removed, except the portion thereof which fills the contact hole CH to form a shielding gate electrode 13 and a portion which constitutes a light shielding layer 14 continuous with the shielding gate electrode 13 which functions to shield the right side shielding gate region 5 from light, it is possible to remove only the portion of the metal layer on the control gate region 4 which is used as the light receiving portion of the photodetector.

According to the present invention, a photodetector constituted by one or more SITs is formed, which photodetector exhibits superior photo response characteristics. Furthermore, according to the present invention, it becomes possible to determine the positions of the control gate and shielding gate regions and the drain (source) region using a single common masking step (the step shown in FIG. 3C), and these positions are exactly defined by the selective oxidation of other positions or portions of these positions. Therefore, it is possible to precisely form the control and shielding gate regions and the drain region with a desired positional relationship therebetween.

We claim:

1. A method for fabricating a photodetector comprising at least one vertical type static induction transistor, comprising the steps of:
    a. forming an oxide layer and a nonoxidizing layer on a first main surface of a silicon wafer;
    b. removing portions of at least said nonoxidizing layer from predetermined regions of said first main surface where a control gate region, a shielding gate region surrounding said control gate region and a first main electrode region between said gate regions are to be formed;
    c. selectively oxidizing said predetermined regions to form a field oxide layer;
    d. removing at least portions of said nonoxidizing layer from regions where said control gate region and said shielding gate region are to be formed to form said control gate region and said shielding gate region, each comprising an oxide layer on said first main surface;
    e. removing portions of said nonoxidizing layer and said oxide layer from the area on said first main surface where said first main electrode region is to be formed;
    f. forming an electrode of a first conductive material in said area where said first main electrode region is to be formed;
    g. covering the entirety of said first main surface of said silicon wafer with a first insulating layer;
    h. removing portions of said first insulating layer and said oxide layer on said control gate region;
    i. covering the entirety of said first main surface of said silicon wafer with a second insulating layer;
    j. forming an electrode of a second conductive material on said second insulating material layer on said control gate region;
    k. removing portions of said second insulating layer, said first insulating layer and said oxide layer on said shielding gate region to form at least one contact hole;
    l. covering the entirety of the first main surface of the silicon wafer with a metal layer;
    m. removing at least a portion of said metal layer on said control gate region; and
    n. forming an electrode for said second main electrode region on said main surface of said silicon wafer.

2. The method as claimed in claim 1, wherein, in Steps b and c, a plurality of control gate regions are formed in an array, and said shielding gate region is patterned so that it surrounds commonly the respective control gate regions.

3. The method as claimed in claim 2, wherein the array of the control gate regions is one dimensional.

4. The method as claimed in claim 2, wherein the array of the control gate regions is two dimensional.

* * * * *